United States Patent
Watanabe

(10) Patent No.: US 6,541,358 B2
(45) Date of Patent: Apr. 1, 2003

(54) METHOD OF FABRICATING A SEMICONDUCTOR DEVICE BY FILLING GAPS BETWEEN GATE ELECTRODES WITH HSQ

(75) Inventor: Susumu Watanabe, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/977,386

(22) Filed: Oct. 16, 2001

(65) Prior Publication Data

US 2002/0052108 A1 May 2, 2002

(30) Foreign Application Priority Data

Oct. 18, 2000 (JP) ........................................ 2000-317387

(51) Int. Cl.[7] .......................................... H01L 21/473
(52) U.S. Cl. ................. 438/533; 438/618; 438/675; 438/763; 438/782; 438/787; 438/791
(58) Field of Search ............................... 438/301, 587, 438/533, 618, 675, 763, 782, 787, 791

(56) References Cited

U.S. PATENT DOCUMENTS 5,855,962 A * 1/1999 Cote et al. ............... 427/376.2
5,976,966 A * 11/1999 Inoue ........................ 438/618
6,117,785 A * 9/2000 Lee et al. .................. 438/700
6,297,125 B1 * 10/2001 Nag et al. .................. 438/421

FOREIGN PATENT DOCUMENTS

JP          6-97302          4/1994

* cited by examiner

Primary Examiner—Carl Whitehead, Jr.
Assistant Examiner—Stephen W. Smoot
(74) Attorney, Agent, or Firm—Young & Thompson

(57) ABSTRACT

A semiconductor device fabrication method of the present invention includes: a step of forming an insulation film on a semiconductor substrate on which a plurality of gate electrodes are formed; a step of applying SOG of HSQ type on the insulation film; a first firing step of firing the resulting substrate at a first temperature in nitrogen atmosphere; a step of forming an oxide film on the SOG of the HSQ type by a CVD method; a step of forming contact holes to expose the semiconductor substrate by removing the insulation film and the SOG of the HSQ type and the oxide film in the regions among a plurality of the gate electrodes; and a second firing step of firing the resulting substrate after the first contact hole formation at a second temperature higher than the first temperature.

8 Claims, 6 Drawing Sheets

METHOD OF FABRICATING A SEMICONDUCTOR DEVICE BY FILLING GAPS BETWEEN GATE ELECTRODES WITH HSQ

BACKGROUND OF THE INVENTION

1. Field of the Invention

The present invention relates to a semiconductor device fabrication method and more particularly relates to a semiconductor device fabrication method of a semiconductor device bearing SOG (Spin-on Glass) containing a large quantity of hydrogen as an interlaminar insulation film to bury gaps of gate electrodes and to a semiconductor device.

2. Description of the Prior Art

Following recent advancement of highly intense integration of IC, a gap between gate electrodes has been narrowed. Especially, since a DRAM is so fabricated as to have a self-alignment contact structure and gate electrodes coated with a SiN film, an aspect ratio of gate electrodes further becomes high.

For that, in the case of an insulation film, an oxide film of such as BPSG (an oxide film containing phosphorus and boron) formed by a chemical vapor deposition (a CVD method) in the past, since voids are formed in the film, it is becoming difficult to bury the insulation film between neighboring gate electrodes.

An example as a method capable of burying an insulation film free from voids in such a narrow gap between gate electrodes includes a method of employing SOG (Spin-on Glass), which is a flat coating film, for burying.

For example, applicable is a method disclosed in Japanese Patent Laid-Open No. 6-97302 of applying SOG with a low viscosity.

However, although it is excellent to be buried, SOG has a high wet etching ratio, therefore its quality is inferior as compared with that of a CVD film of such as a conventional BPSG or the like.

Further, as the intrinsic properties of the SOG film, the parts buried in recessed parts cannot sufficiently be shrunk to result in the sparse film quality as compared with that in flat parts other than in the recessed parts.

That is, if SOG is used as an insulation film to fill the gaps between neighboring insulation films, the film quality becomes sparse only in the gaps between neighboring insulation films. Therefore, there is occurred such a problem that only the SOG between the neighboring gate electrodes is etched by treatment with diluted hydrofluoric acid, a pretreatment for plug electrode formation, after contact hole formation and it results in occurrence of short circuit if the plug electrode formation is carried out in such a state.

BRIEF SUMMARY OF THE INVENTION

OBJECT OF THE INVENTION

The purpose of the present invention is to provide a semiconductor device fabrication method capable of providing the excellent contact shape and the excellent contact resistance properties.

SUMMARY OF THE INVENTION

The semiconductor device fabrication method of the present invention includes: a step of forming an insulation film on a semiconductor substrate on which a plurality of gate electrodes are formed; a step of applying SOG of HSQ type on the insulation film; a first firing step of firing the resulting substrate at a first temperature in nitrogen atmosphere; a step of forming an oxide film on the SOG of the HSQ type by a CVD method; a step of forming contact holes to expose the semiconductor substrate by removing the insulation film, the SOG of the HSQ type and the oxide film in the regions among a plurality of the gate electrodes; and a second firing step of firing the resulting substrate after the first contact hole formation at a second temperature higher than the first temperature.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Embodiments of the present invention will be described with the reference to the drawings.

Figure 1A:
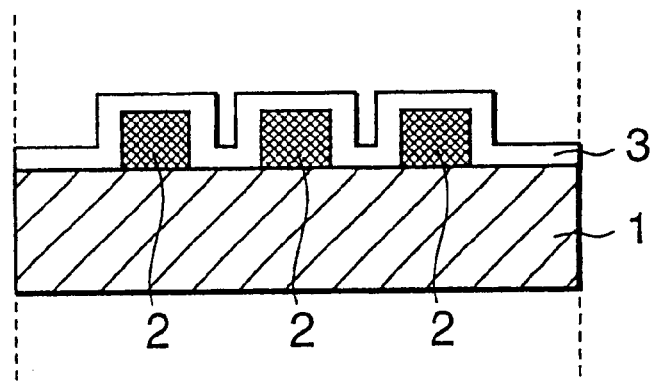
FIG. 1A to FIG. 1C are schematic cross-sectional views of a semiconductor device illustrating steps of a semiconductor device fabrication method according to a first embodiment of the present invention.

At first, as shown in FIG. 1A, a SiN film 3, an insulating film, in a blanket-like state is formed on a gate electrode 2 previously formed on a silicon substrate 1.

Figure 1B:
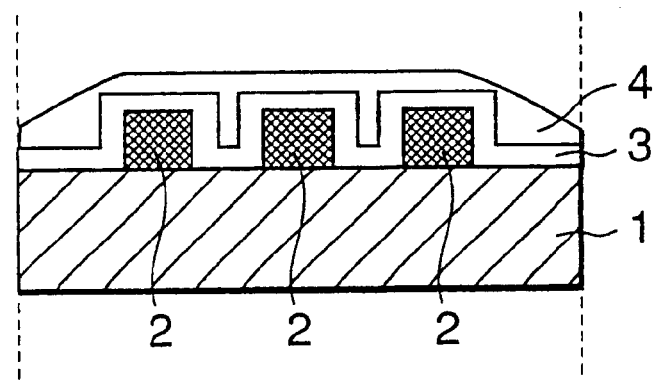

Next, as shown in FIG. 1B, SOG 4 of HSQ (hydrogen silisesquioxane) type containing a larger quantity of hydrogen than that of a conventional SOG is applied in degree of 3,000 to 4,000 Å and fired as the first firing. Practically, for example, the temperature condition (the first temperature) in the first firing step is 300 to 400° C. and firing is carried out in the nitrogen atmosphere.

Figure 1C:
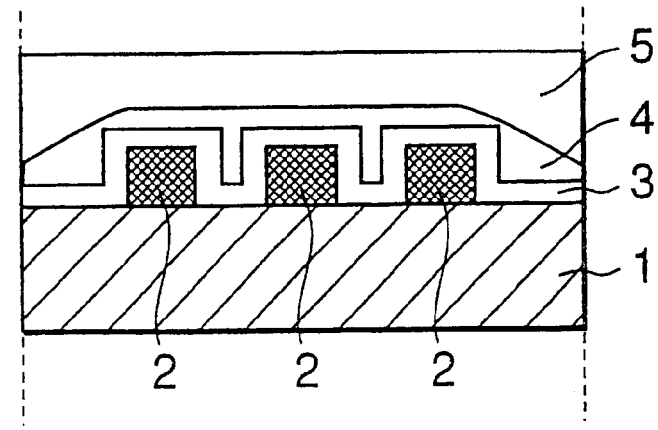

Next, as shown in FIG. 1C, in order to make the film globally flat, an oxide film 5 is formed by a CVD method and the oxide film 5 is subjected to a chemical mechanical polishing (a CMP method). Concretely, for example, an oxide film 5 in about 8,000 Å thickness is formed by a plasma CVD method and the CMP method is carried out as to polish the oxide film 5 in the projected part to be degree of 5,000 Å.

Figure 2A:
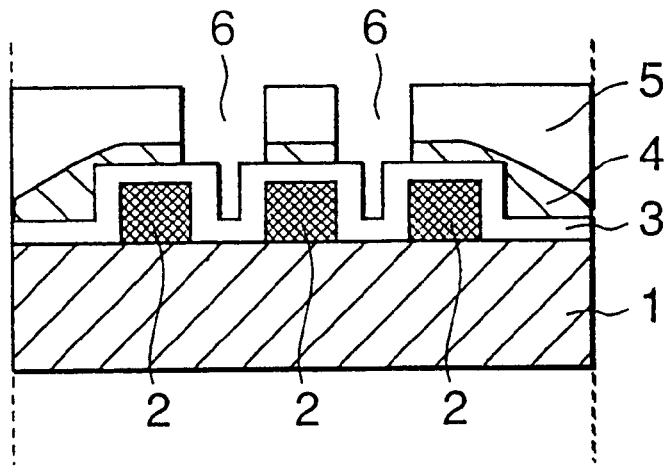
FIG. 2A to FIG. 2C are schematic cross-sectional views of the semiconductor device illustrating the steps of a semiconductor device fabrication method according to the first embodiment of the present invention.

Next, as shown in FIG. 2A, patterning for contact holes is carried out by lithographic technique and contact holes 6

(self-aligned contact: SAC) are formed by dry etching in conditions in which the selective ratio of the SiN film 3 and the oxide film 5 is to be a prescribed selective ratio. After the contact hole formation, second firing is carried out in the state where the SOG 4 is exposed in the contact hole side wall. The second firing is carried out in the temperature condition (the second temperature) of 700 to 800° C. and in nitrogen or diluted steam-containing atmosphere.

Figure 2B:
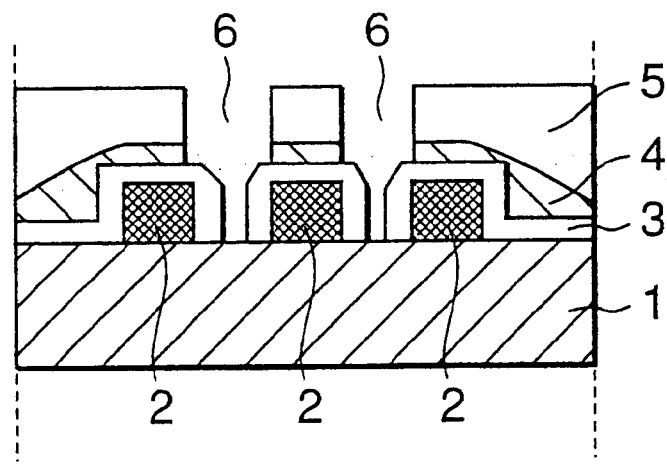

Next, as shown in FIG. 2B, in order to remove the SiN film 3 in the bottom parts of the contact holes 6, etching back is carried out by a dry etching method.

Figure 2C:
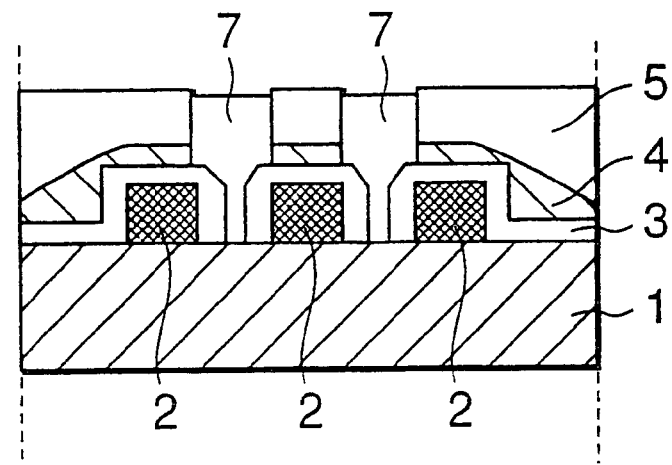

Next, ion implantation is carried out to lower the resistance of the contact resistance. Then, in order to remove the spontaneous oxide film on the silicon substrate 1 in the bottom parts of the contact holes 6, treatment with diluted hydrofluoric acid is carried out and after that, a polysilicon film is formed by a thermal CVD method and plug electrodes 7 are formed by etching back the polysilicon film to fabricate a semiconductor device as shown in FIG. 2C.

Further, a semiconductor device according to the present embodiment will be described in details.

Figure 3A:
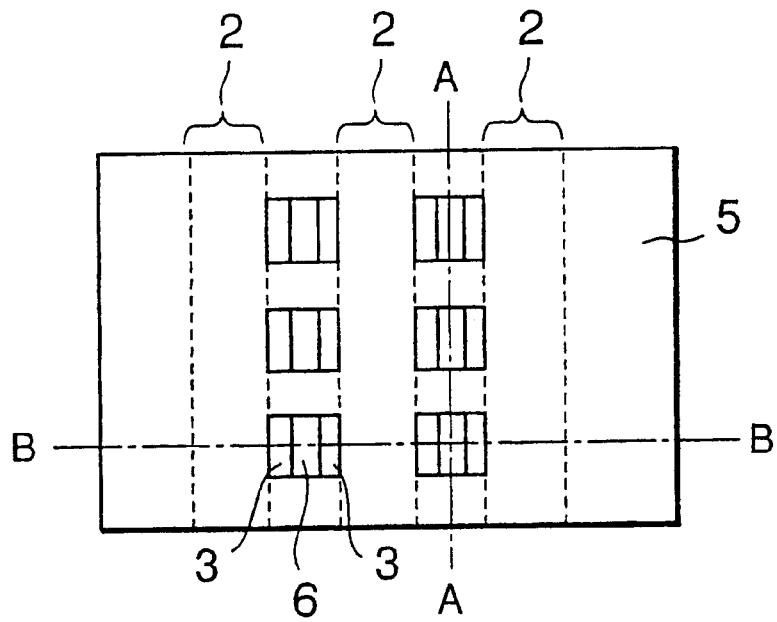
FIG. 3A to FIG. 3C are schematic cross-sectional views of the semiconductor device illustrating the semiconductor device according to the first embodiment of the present invention after contact hole formation.
Figure 3B:
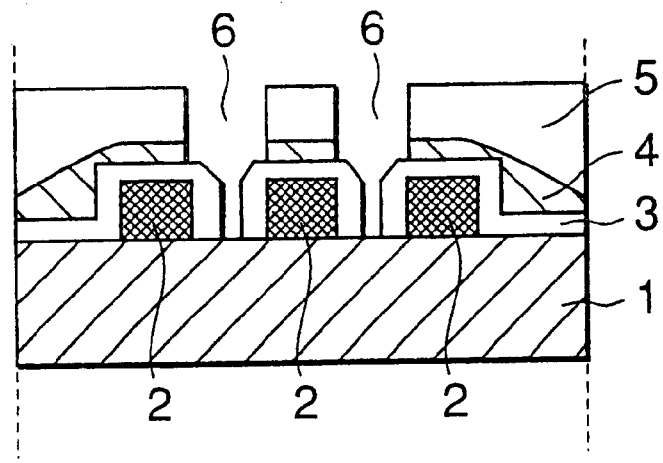
Figure 3C:
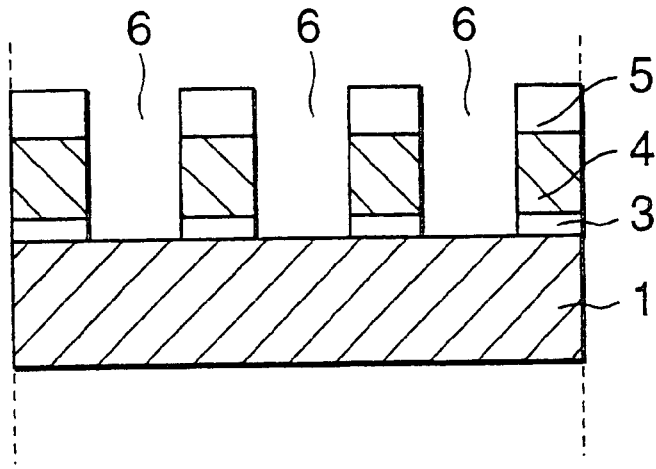

FIGS. 3A to 3C are schematic views of a semiconductor device of the embodiment of the present invention after the contact hole formation (the step shown in FIG. 2B): FIG. 3A is a schematic plan view; FIG. 3B is a schematic cross-sectional view along a B—B line (the same drawing as FIG. 2B); and FIG. 3C is a schematic cross-sectional view along a A—A line.

Regarding the semiconductor device according to the embodiment of the present invention, since it becomes difficult to form an insulating film free from voids as to fill a gap by a CVD method if the gap between neighboring gate electrodes becomes narrow as the description of FIG. 1A, the filling insulating film is formed in the state where the film is free from voids using SOG, which is an applied film remarkably excellent in filling property.

Generally, a SOG film is converted to be a dense film by firing after application, the SOG is shrunk not a little at the time of firing. Conventionally widely used SOG is shrunk by degree of 10 to 20% by firing at 400° C.

The volume of SOG to be shrunk differs in a recessed part like a groove or in a flat part free of projected or recessed parts to form the SOG film on and the quality of the film also differs.

That is, SOG can sufficiently be shrunk on a flat part free from projected or recessed parts to have a dense film quality, whereas it cannot sufficiently be shrunk in a recessed part like a groove to have a sparse film quality and the width of the groove becomes narrower, the SOG becomes more difficult to be shrunk to have a sparser film quality.

On the other hand, the shrinkage ratio of SOG of the HSQ type containing a large quantity of hydrogen is as extremely low as 1 to 3% in the case of thermal treatment at about 400° C. and regardless of the shape of the face to be coated, the film quality hardly differs. The extremely low film shrinkage ratio is attributed to that a large quantity of hydrogen remains in the film.

However, on the contrary to the low shrinkage, the film quality becomes sparse and the wet etching rate by a diluted hydrofluoric acid is remarkably high as compared with that of an oxide film formed by a CVD method.

Also, the SOG of the HSQ type is fired at a temperature as high as about 700 to 800° C., hydrogen in the film is almost all isolated and eliminated, so that about 20% shrinkage occurs in the same manner as in the case of a conventional SOG.

Next, description will be given regarding the comparison of the present embodiment and a conventional semiconductor device (in case of using a conventional SOG) in the treatment with diluted hydrofluoric acid after the contact hole formation (FIG. 3C).

Figure 4A:
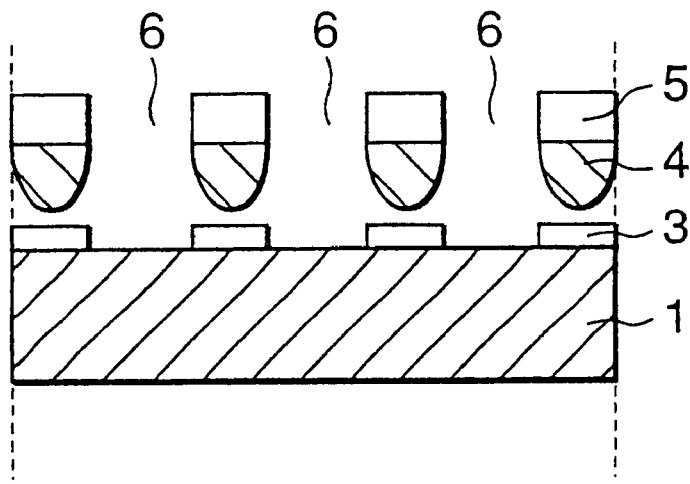
FIG. 4A and FIG. 4B are schematic cross-sectional views illustrating a treatment with a diluted hydrofluoric acid after contact hole formation.
Figure 4B:
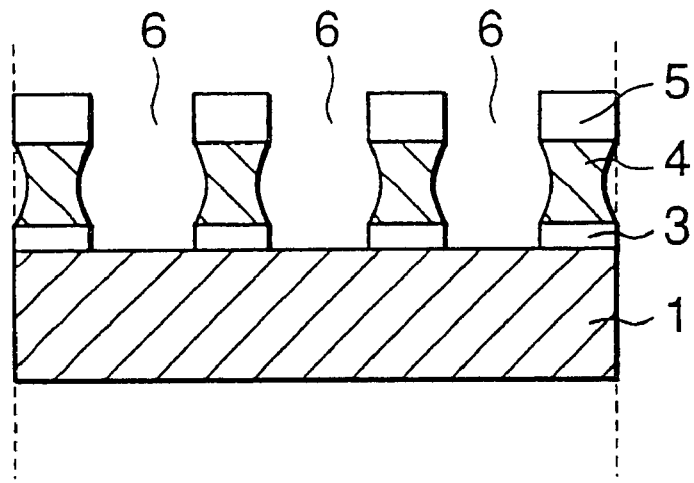

FIGS. 4A to 4B are schematic views illustrating the treatment with a diluted hydrofluoric acid after contact hole formation: FIG. 4A is a conventional semiconductor device (in case of using a conventional SOG) and FIG. 4B is a semiconductor device of the present embodiment.

As in the case of a conventional semiconductor device, if a conventional SOG is used as an interlaminar insulation film for filling the gap between neighboring gate electrodes, SOG 4 only in the groove-like recessed part is dissolved, as shown in FIG. 4A, by the treatment with a diluted hydrofluoric acid after contact hole formation (FIG. 3C).

That is, as described above, attributed to that the SOG 4 in the recessed part cannot sufficiently be shrunk and the film quality becomes sparse. If plug electrodes of polysilicon are formed in such a state, a short circuit takes place.

In the present embodiment, in order to avoid such disadvantages, SOG of the HSQ type containing a large quantity of hydrogen is employed and fired at about 300 to 400° C., at which the shrinkage scarcely takes place, in the firing step immediately after application and after contact holes are formed, firing at a temperature as high as about 700 to 800° C. is carried out.

Owing to the contact hole formation, the SOG 4 is provided with spatially free sites to easily shrink by the high temperature firing and the contact holes 6 are made to have slightly arced shapes as shown in FIG. 4B owing to the shrinkage. Due to the shrinkage, a dense film can be formed and the wet etching rate by a diluted hydrofluoric acid is retarded.

Further, the atmosphere for the firing at 700 to 800° C. may be nitrogen atmosphere, oxidation proceeds more in case of firing in diluted steam atmosphere to give a denser film quality.

Next, a second embodiment of the present invention will be described with the reference of FIGS. 5A to 5C and FIGS. 6A to 6B.

At first, in the same manner as the first embodiment, steps to the contact hole formation (FIG. 2B) are carried out.

Figure 5A:
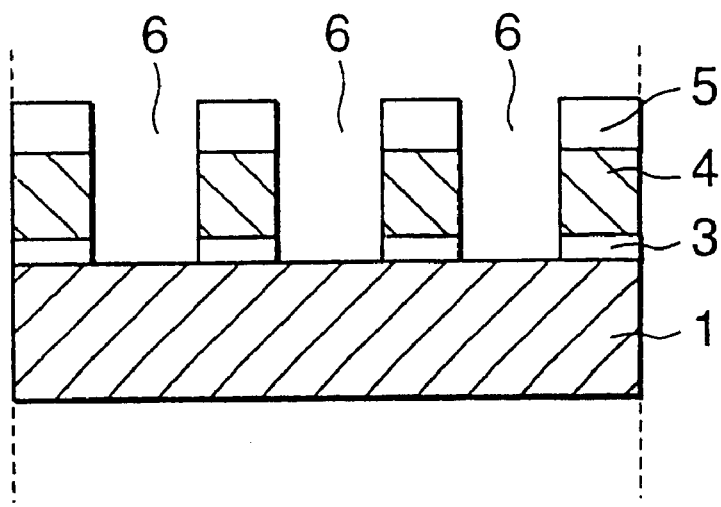
FIG. 5A to FIG. 5C are schematic cross-sectional views of a semiconductor device illustrating steps of a semiconductor device fabrication method according to a second embodiment of the present invention.
Figure 5B:
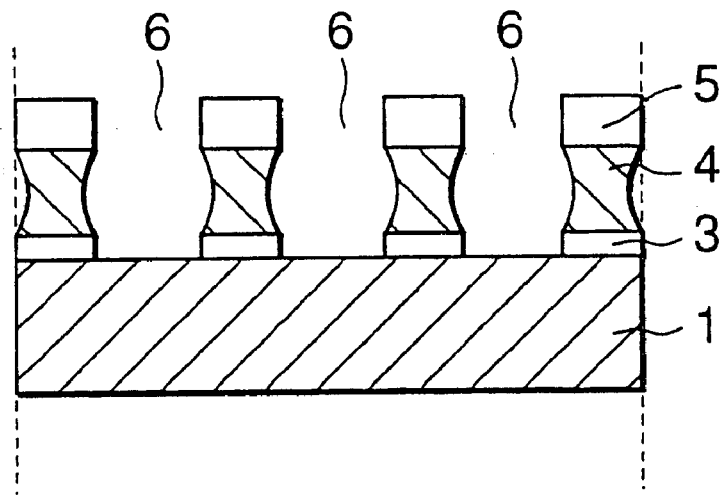

As the resulting state at that time as shown in FIG. 3C. a cross-sectional view in the direction parallel to the gate electrode is shown in FIG. 5A. After the formation, in the same manner as the first embodiment, the second firing at 700 to 800° C. is carried out in nitrogen or diluted steam atmosphere to densify SOG filling the gap between neighboring gate electrodes and since the SOG is shrunk as shown in FIG. 5B, the shapes of the contact holes become slightly arcing shapes.

Figure 5C:
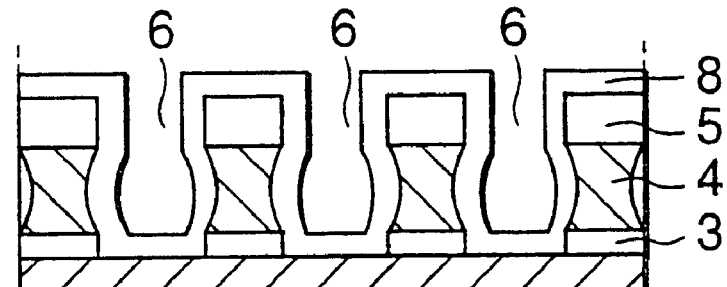

The present embodiment can be characterized by improving such slightly arcing shapes and as shown in FIG. 5C, after the above described second firing at 700 to 800° C., a SiN film 8 with degree of 100 to 1,000 Å thick is formed by a thermal CVD method. Alternatively, in place of the film formation by the thermal CVD method, film formation may be carried out by a plasma CVD method. Further, in place of the SiN film, a SiO film may be employed.

Figure 6A:
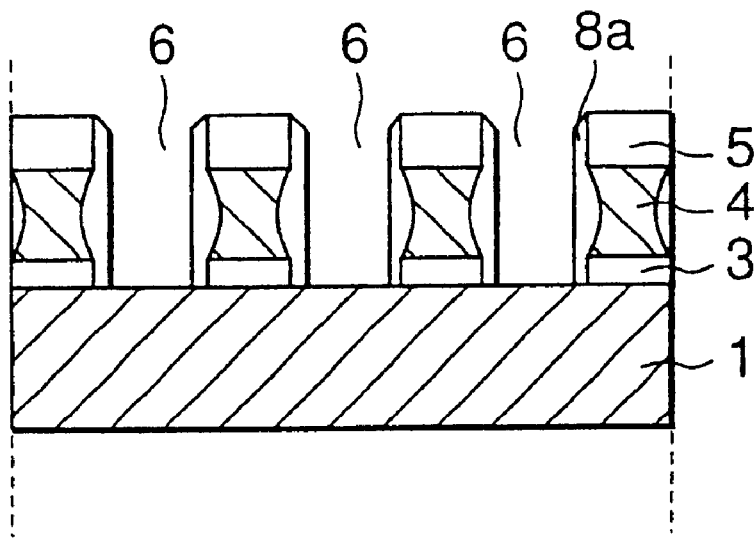
FIG. 6A and FIG. 6B are schematic cross-sectional views of a semiconductor device illustrating the steps of a semiconductor device fabrication method according to the second embodiment of the present invention.

Next, as shown in FIG. 6A, etching back is carried out by a dry etching method to form side walls 8a. Consequently, the shapes of the contact holes 6 are improved as compared with those in the case where no side wall 8a is formed as shown in FIG. 5B.

Figure 6B:
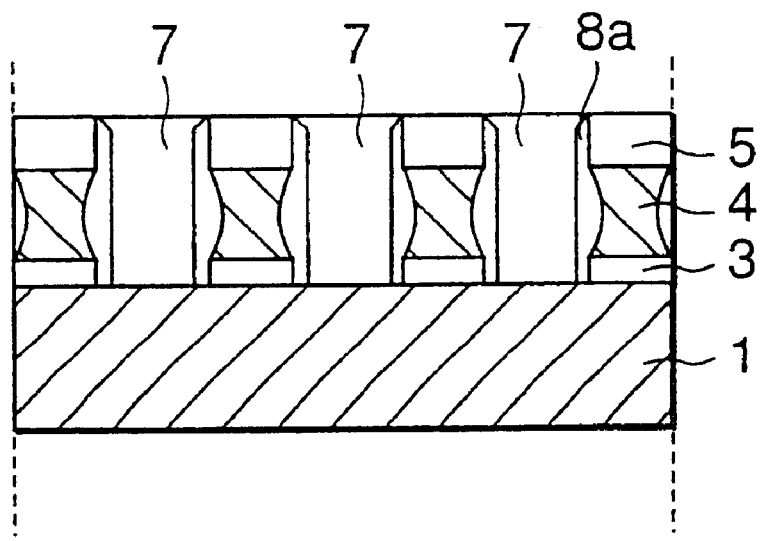

Next, as shown in FIG. 6B, ion implantation is carried out to lower the resistance of the contact resistance. Following that, in order to remove the spontaneous oxide film on the silicon substrate 1 in the bottom parts of the contact holes 6, treatment with a diluted hydrofluoric acid is carried out and after that, a polysilicon film is formed by a thermal CVD method and plug electrodes 7 are formed by etching back to fabricate a semiconductor device according to the present embodiment.

According to the semiconductor device fabrication method and the semiconductor device according to the present invention, using the SOG of the HSQ type containing a large quantity of hydrogen for the interlaminar insulation film filling the gap between neighboring gate electrodes of a semiconductor element, the SOG can be densified and the resistance to wet etching with a hydrofluoric acid-based etchant, which is the pretreatment for contact electrode formation, can be improved by firing the SOG at a temperature as low as 300 to 400° C. in nitrogen atmosphere immediately after application of the SOG and further firing at a temperature as high as degree of 700 to 800° C. in nitrogen atmosphere or in diluted steam atmosphere after the contact hole formation.

Further, the insulation film between the neighboring gate electrodes can be formed while being made free from voids and excellent contact shapes and desirable contact resistance properties can be obtained.

Based on those effects, the present invention can provide a semiconductor device fabrication method capable of improving the production yield of products and provide a semiconductor device.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device fabrication method, comprising:
   a step of forming a first insulation film on a semiconductor substrate on which a plurality of gate electrodes are formed;
   a step of applying SOG of HSQ type on said first insulation film;
   a first firing step of firing said semiconductor substrate at a first temperature in nitrogen atmosphere;
   a step of forming an oxide film on said SOG of said HSQ type by a CVD method;
   a step of forming contact holes to expose said semiconductor substrate by removing said first insulation film, said SOG of said HSQ type and said oxide film in regions among a plurality of said gate electrodes; and
   a second firing step of firing said semiconductor substrate at a second temperature higher than said first temperature in nitrogen atmosphere or diluted steam after said contact hole formation.

2. The semiconductor device fabrication method as set forth in claim 1, wherein said range of said first temperature is from 300° C. to 400° C. and said range of said second temperature is from 700° C. to 800° C.

3. The semiconductor device fabrication method as set forth in claim 1, wherein said first insulation film is SiN.

4. The semiconductor device fabrication method as set forth in claim 1, further comprising the steps of:
   removing said first insulation film in bottoms of said contact holes after said second firing step;
   ion-implanting in said semiconductor substrate through said contact holes;
   removing a spontaneous oxide film in said bottoms of said contact holes; and
   forming plug electrodes filling said contact holes.

5. The semiconductor device fabrication method as set forth in claim 1, further comprising the steps of:
   forming a second insulation film on an entire surface of said semiconductor substrate including side faces of said contact holes by a CVD method after said second firing step;
   forming side walls in said contact hole side faces by a dry etching method;
   ion-implanting in said semiconductor substrate through said contact holes;
   removing a spontaneous oxide film in bottoms of said contact holes; and
   forming plug electrodes filling said contact holes.

6. The semiconductor device fabrication method as set forth in claim 5, wherein said second insulation film has a thickness within a range from 100 Å to 1,000 Å.

7. The semiconductor device fabrication method as set forth in claim 5, wherein said second insulation film is SiN.

8. The semiconductor device fabrication method as set forth in claim 5, wherein said second insulation film is SiO.

* * * * *